US012660568B2

(12) United States Patent
Inoue et al.

(10) Patent No.: US 12,660,568 B2
(45) Date of Patent: Jun. 16, 2026

(54) WAFER PLACEMENT TABLE

(71) Applicant: NGK INSULATORS, LTD.,
Nagoya-City (JP)

(72) Inventors: Seiya Inoue, Handa-City (JP); Tatsuya Kuno, Nagoya-City (JP); Shinya Yoshida, Nagoya-City (JP); Takahiro Ando, Nagoya-City (JP)

(73) Assignee: NGK INSULATORS, LTD., Nagoya (JP)

( * ) Notice: Subject to any disclaimer, the term of this patent is extended or adjusted under 35 U.S.C. 154(b) by 153 days.

(21) Appl. No.: 18/583,957

(22) Filed: Feb. 22, 2024

(65) Prior Publication Data

US 2025/0079229 A1     Mar. 6, 2025

Related U.S. Application Data

(63) Continuation of application No. PCT/JP2023/032177, filed on Sep. 4, 2023.

(51) Int. Cl.
  *H10P 72/76*       (2026.01)
  *H01J 37/32*       (2006.01)
  *H10P 72/72*       (2026.01)

(52) U.S. Cl.
  CPC ........ *H10P 72/7616* (2026.01); *H10P 72/722* (2026.01); *H01J 37/32577* (2013.01); *H01J 37/32724* (2013.01)

(58) Field of Classification Search
  CPC ........... H01L 21/68757; H01L 21/6833; H01L 21/67103; H01L 21/6831; H01L 21/68785; H01J 37/32577; H01J 37/32724; H01J 37/32715; H02N 13/00

USPC .......................................................... 361/234
See application file for complete search history.

(56) References Cited

U.S. PATENT DOCUMENTS

| | | | |
|---|---|---|---|
| 2008/0116187 A1* | 5/2008 | Sugimoto | H05B 3/143 |
| | | | 219/200 |
| 2012/0250211 A1 | 10/2012 | Kida et al. | |
| 2017/0069520 A1 | 3/2017 | Unno | |
| 2020/0135526 A1 | 4/2020 | Takahashi | |

(Continued)

FOREIGN PATENT DOCUMENTS

| | | |
|---|---|---|
| JP | 2002-231798 A | 8/2002 |
| JP | 2008-130609 A | 6/2008 |

(Continued)

OTHER PUBLICATIONS

Korean Office Action (Application No. 10-2024-7008436) dated May 13, 2025 (with English translation) (12 pages).

(Continued)

*Primary Examiner* — Sreeya Sreevatsa
(74) *Attorney, Agent, or Firm* — BURR PATENT LAW, PLLC

(57) ABSTRACT

A wafer placement table includes: a ceramic substrate that has a wafer placement surface at an upper surface of the ceramic substrate; an electrode that is incorporated in the ceramic substrate; and an electrically conductive electrode extraction portion that is incorporated in the ceramic substrate and is electrically connected to the electrode. A volume content percentage of a ceramic material that is identical to a main component of the ceramic substrate is high in the electrode extraction portion compared with the electrode.

18 Claims, 7 Drawing Sheets

(56)          References Cited

U.S. PATENT DOCUMENTS

| | | | |
|---|---|---|---|
| 2020/0173017 A1* | 6/2020 | Ramalingam ....... | C23C 16/4581 |
| 2023/0122013 A1 | 4/2023 | Inoue et al. | |
| 2023/0223245 A1* | 7/2023 | Takebayashi ..... | H01J 37/32724 |
| | | | 361/234 |

FOREIGN PATENT DOCUMENTS

| | | | |
|---|---|---|---|
| JP | 2012-216786 A | | 11/2012 |
| JP | 6077258 B2 | | 2/2017 |
| JP | 2017-228360 A | | 12/2017 |
| JP | 2019140164 A | * | 8/2019 |
| JP | 2023-058845 A | | 4/2023 |
| KR | 10-2020-0014354 A | | 2/2020 |
| KR | 10-2023-0109080 A | | 7/2023 |
| WO | 2015/198892 A1 | | 12/2015 |
| WO | 2019/208191 A1 | | 10/2019 |

OTHER PUBLICATIONS

International Search Report and Written Opinion (Application No. PCT/JP2023/032177) dated Nov. 7, 2023 (7 pages).

Japanese Office Action (Application No. 2024-509360) dated Dec. 3, 2024 (4 pages).

Japanese Notice of a Written Opposition (Application No. 2025-701049; Patent No. 7675285) dated Dec. 3, 2025 (23 pages).

English translation of the International Preliminary Report on Patentability (Chapter I) (Application No. PCT/JP2023/032177) mailed Mar. 12, 2026 (6 pages).

* cited by examiner

WAFER PLACEMENT TABLE

BACKGROUND OF THE INVENTION

1. Field of the Invention

The present invention relates to a wafer placement table.

2. Description of the Related Art

A wafer placement table including a ceramic substrate that has a wafer placement surface, an electrode that is embedded in the inside of the ceramic substrate, and a power supply member for supplying electric power to the electrode has been known. In PTL 1, an electrode terminal, which is a portion of the electrode, is provided to be exposed at a surface opposite to the wafer placement surface of the ceramic substrate, and the power supply member and the electrode terminal are electrically connected to each other. In addition, there are described use of an electrically conductive material and use of a mixture of an electrically conductive material and a material of the ceramic substrate in the electrode.

CITATION LIST

Patent Literature

PTL 1: Japanese Unexamined Patent Application Publication No. 2012-216786

SUMMARY OF THE INVENTION

Meanwhile, there has been a case, when a difference in coefficient of thermal expansion between an electrode terminal (electrode extraction portion) and a ceramic substrate is large, where a temperature change causes a stress to be applied from the electrode terminal to an electrode and causes separation and cracking of the electrode. As described in PTL 1, it is possible to reduce a difference in coefficient of thermal expansion between the electrode terminal and the ceramic substrate by including, in the electrode and the electrode terminal, a material of the ceramic substrate. However, when a large amount of the material of the ceramic substrate is included in the electrode, the resistance value of the electrode increases, which is not preferable.

The present invention has been made to solve such a problem, and a main object of the present invention is to suppress a stress that is applied to an electrode due to a temperature change while suppressing an increase in the resistance value of the electrode.

The present invention employs following measures to achieve the main object described above.

A wafer placement table according to the present invention includes: a ceramic substrate that has a wafer placement surface at an upper surface of the ceramic substrate; an electrode that is incorporated in the ceramic substrate; and an electrically conductive electrode extraction portion that is incorporated in the ceramic substrate and is electrically connected to the electrode, in which a volume content percentage of a ceramic material that is identical to a main component of the ceramic substrate is high in the electrode extraction portion compared with the electrode.

In the wafer placement table, the volume content percentage of the ceramic material identical to the main component of the ceramic substrate is high in the electrode extraction portion compared with the electrode.

Consequently, the electrode extraction portion can reduce a difference in coefficient of thermal expansion between the ceramic substrate and the electrode extraction portion. Therefore, separation and cracking of the electrode caused by a stress that is applied from the electrode extraction portion to the electrode due to a temperature change can be suppressed. Meanwhile, since the volume content percentage of the ceramic material identical to the main component of the ceramic substrate is low in the electrode compared with the electrode extraction portion, a malfunction caused by an excessive increase in the resistance value of the electrode can be suppressed. From the above, it is possible in this wafer placement table to suppress the stress that is applied to the electrode due to a temperature change while suppressing an increase in the resistance value of the electrode.

In the above-described wafer placement table (the wafer placement table described in [1] above), a portion of an upper surface of the electrode extraction portion may be a substrate joint region that is joined to the ceramic substrate. In such a case, the electrode extraction portion is in close contact with the ceramic substrate in the substrate joint region. Thus, even when a stress that is caused by a difference in thermal expansion between the electrode extraction portion and the ceramic substrate due to a temperature change is generated, the stress is not easily applied to the electrode.

In the above-described wafer placement table (the wafer placement table described in [2] above), the substrate joint region may include a portion of an outer peripheral edge portion of the upper surface of the electrode extraction portion. Here, the stress that is applied to the electrode due to a temperature change easily increases, in particular, around the outer peripheral edge portion of the upper surface of the electrode extraction portion. Therefore, including a portion of the outer peripheral edge portion in the substrate joint region can further reduce the stress that is applied to the electrode due to a temperature change.

The above-described wafer placement table (the wafer placement table described in any of [1] to [3] above) may include a power supply member that is disposed to be inserted from a lower surface of the ceramic substrate and is electrically connected to the electrode extraction portion, and a plurality of the electrode extraction portions may be provided with respect to the power supply member, which is one power supply member. In such a case, the stress that is caused by a difference in thermal expansion between the electrode extraction portion and the ceramic substrate due to a temperature change can be reduced compared with a case in which one electrode extraction portion having a volume identical to a total volume of the plurality of electrode extraction portions is provided. In this case, a portion of the upper surface of each of the plurality of provided electrode extraction portions may have a substrate joint region joined to the ceramic substrate.

In the above-described wafer placement table (the wafer placement table described in any of [1] to [4] above), the electrode extraction portion may have a through hole that extends through the electrode extraction portion in an up-down direction. In such a case, the electrode extraction portion has a reduced volume due to having the through hole. It is thus possible to reduce the stress caused by a difference in thermal expansion between the electrode extraction portion and the ceramic substrate due to a temperature change.

In the above-described wafer placement table (the wafer placement table described in any of [1] to [5] above), the electrode extraction portion may have a large thickness in an up-down direction compared with the electrode. When the electrode extraction portion has a larger thickness than the electrode, the stress caused by a difference in thermal expansion between the electrode extraction portion and the ceramic substrate due to a temperature change easily increases. Thus, significance of applying the present invention is high.

In the above-described wafer placement table (the wafer placement table described in any of [1] to [6] above), the ceramic material may be alumina or aluminum nitride.

DETAILED DESCRIPTION OF THE INVENTION

Figure 1:
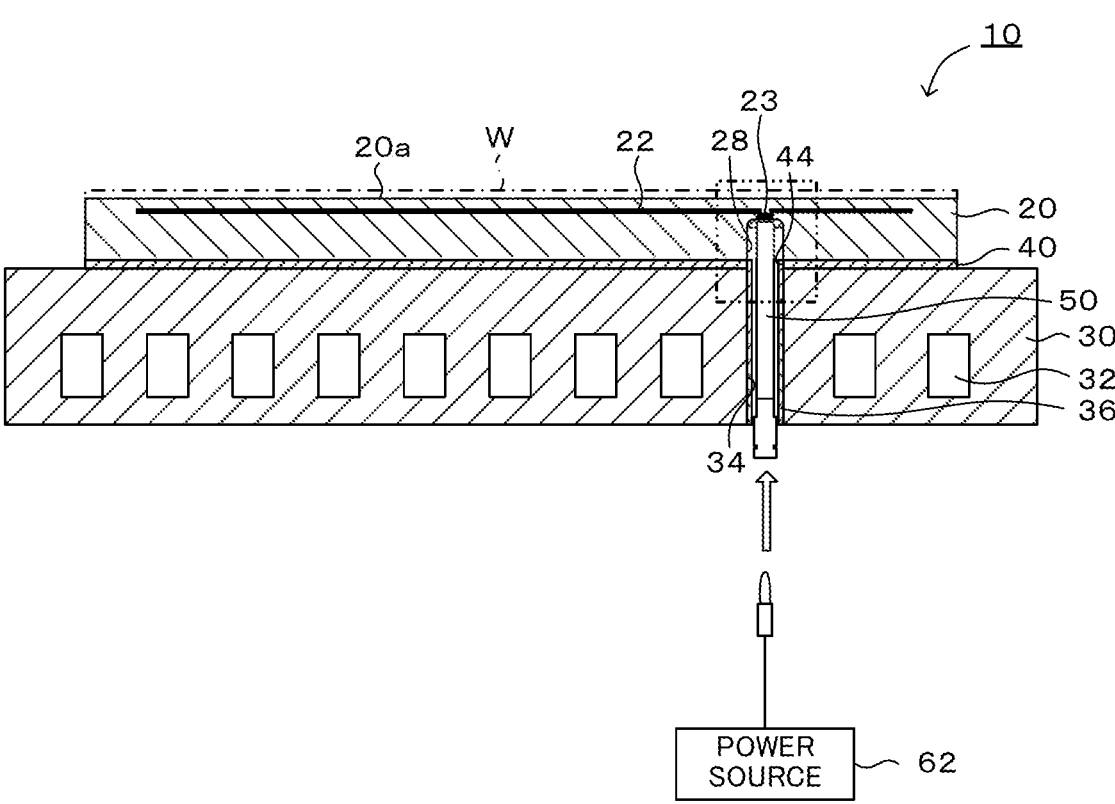
FIG. 1 is a sectional view illustrating a general configuration of a wafer placement table 10.
Figure 2:
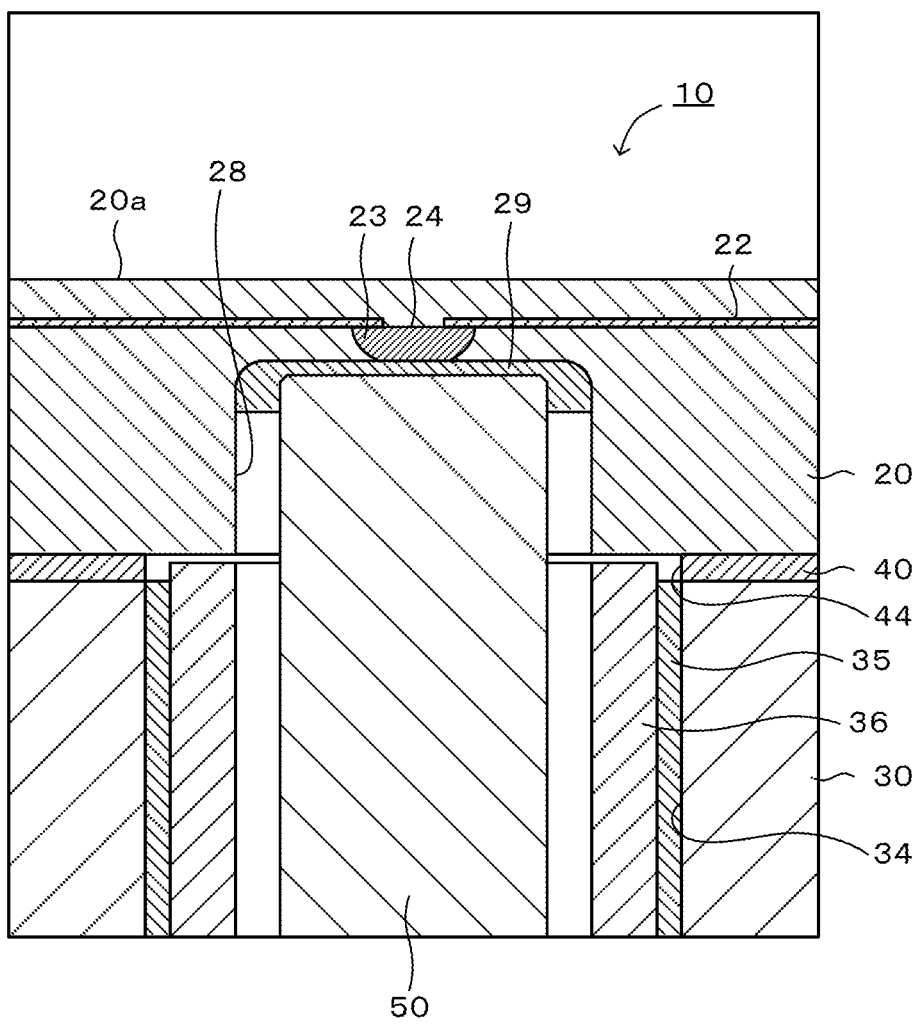
FIG. 2 is an enlarged view of a portion of FIG. 1.
Figure 3:
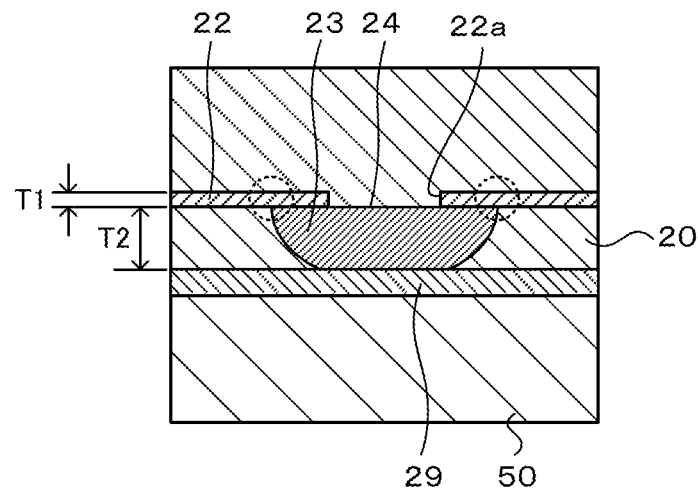
FIG. 3 is an enlarged view of a periphery of an electrode extraction portion 23 in FIG. 2.
Figure 4:
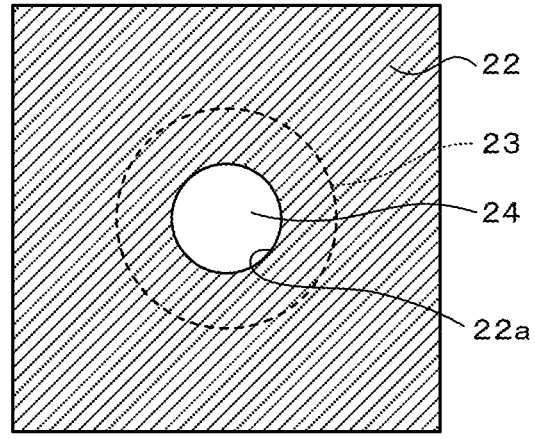
FIG. 4 is a partial top view of an electrode 22 and the electrode extraction portion 23.

Next, an embodiment of the present invention will be described with the drawings. FIG. 1 is a sectional view (a sectional view obtained by cutting the wafer placement table 10 along a surface including a center axis of the wafer placement table 10) illustrating a general configuration of the wafer placement table 10 in the present embodiment. FIG. 2 is an enlarged view (an enlarged view of the portion in the frame indicated by the dashed double-dotted line in FIG. 1) of a portion of FIG. 1. FIG. 3 is an enlarged view of a periphery of an electrode extraction portion 23 in FIG. 2. FIG. 4 is a partial top view (a top view of a periphery of the electrode extraction portion 23) of an electrode 22 and the electrode extraction portion 23. In FIG. 4, a region in which the electrode 22 is present is hatched for easy understanding of a positional relationship between the electrode 22 and the electrode extraction portion 23.

As illustrated in FIG. 1, the wafer placement table 10 includes a ceramic substrate 20, a cooling plate 30, a joining layer 40, and a power supply member 50.

The ceramic substrate 20 is a disk-shaped member having a wafer placement surface 20a at the upper surface thereof. The ceramic substrate 20 is made of a ceramic-containing material. The ceramic-containing material is a material containing a ceramic material as a main component and may contain, in addition to the ceramic material, components (for example, rare earth element and the like) derived from a sintering auxiliary agent, an inevitable component, and the like. The main component is a component whose volume content percentage to the entirety is 50 vol % or more. In the ceramic substrate 20, the volume content percentage of the ceramic material as the main component may be 80 vol % or more and may be 90 vol % or more. An example of the ceramic material is alumina, aluminum nitride, or the like. The main component of the ceramic substrate 20 is alumina in the present embodiment.

The ceramic substrate 20 incorporates the electrode 22 and the electrode extraction portion 23. The electrode 22 and the electrode extraction portion 23 have electrical conductivity. The electrode 22 is a tabular monopolar electrode. The electrode 22 is a disk-shaped electrode in the present embodiment. The electrode extraction portion 23 is a member having a spherical frustum shape (a shape obtained by cutting a sphere along two horizontal surfaces). The electrode extraction portion 23 is electrically connected to the electrode 22. The electrode extraction portion 23 is disposed below the electrode 22, and a portion of the upper surface of the electrode extraction portion 23 is in contact with the lower surface of the electrode 22. The lower surface of the electrode extraction portion 23 is exposed at the bottom surface of a power-supply-member insertion hole 28 and is in contact with a brazing material layer 29 provided at the bottom surface of the power-supply-member insertion hole 28. The electrode extraction portion 23 has a large thickness in the up-down direction compared with the electrode 22. In other words, as illustrated in FIG. 3, a thickness T2 of the electrode extraction portion 23 is larger than a thickness T1 of the electrode 22. The thickness T2 is, for example, 0.1 mm or more and 1 mm or less. The thickness T1 is, for example, 0.01 mm or more and 0.03 mm or less. The thickness T2 may be ten times or more or twenty times or more of the thickness T1. The electrode 22 is used as an electrostatic electrode in the present embodiment. A layer of the ceramic substrate 20 on the upper side of the electrode 22 functions as a dielectric layer. A power source 62 that is a direct-current power source for electrostatic attraction is connected to the electrode 22 with the power supply member 50 interposed therebetween.

A portion of the upper surface of the electrode extraction portion 23 is a substrate joint region 24 that is joined to the ceramic substrate 20. In the present embodiment, a circular through hole 22a is formed (FIG. 4) at a position in the electrode 22, the position overlapping the electrode extraction portion 23 when imaginarily seen through from above, and a portion of the upper surface of the electrode extraction portion 23, the portion positioned directly under the through hole 22a, is the substrate joint region 24. When seen through imaginarily from above, the through hole 22a overlaps a central portion of the electrode extraction portion 23. The through hole 22a is provided to be concentric with the electrode extraction portion 23 in top view. The diameter of the through hole 22a is smaller than the diameter of the electrode extraction portion 23. Therefore, when seen through imaginarily from above, the entirety of the through hole 22a is included in the electrode extraction portion 23, and the entirety of the through hole 22a coincides with the substrate joint region 24. Since the through hole 22a is present directly above the substrate joint region 24, the electrode 22 is not present directly above the substrate joint region 24.

The electrode 22 and the electrode extraction portion 23 each contain a conductive material such as, for example, W, Mo, WC, MOC, Ru, or TiN. As conductive materials used in the electrode 22 and the electrode extraction portion 23, conductive materials having coefficients of thermal expansion that are close to the coefficient of thermal expansion of the ceramic substrate 20 are preferable. It is preferable that the type of the conductive material contained in the electrode 22 and the type of the conductive material contained in the electrode extraction portion 23 be the same. The conductive material contained in the electrode 22 and/or the electrode extraction portion 23 may be a plurality of types of materials. The electrode 22 and the electrode extraction portion 23 each contain a ceramic material (alumina in the present embodiment) that is identical to the main component of the ceramic substrate 20. Consequently, the coefficients of thermal expansion of the electrode 22 and the electrode extraction portion 23 can be close to the coefficient of thermal expansion of the ceramic substrate 20. It is not necessary for the electrode 22 to contain a ceramic material identical to the main component of the ceramic substrate 20. The electrode 22 and the electrode extraction portion 23 may each contain, in addition to a conductive material and a ceramic material, components (for example, a rare earth element and the like) derived from a sintering auxiliary agent, an inevitable component, and the like. When the volume content percentage of the ceramic material identical to the main component of the ceramic substrate 20 is C1 and C2 [vol %] in the electrode 22 and the electrode extraction portion 23, respectively, the volume content percentage C2 is higher than the volume content percentage C1. For example, the volume content percentage C1 in the electrode 22 may be 0 vol % or more, may be 10 vol % or more, and may be 30 vol % or more. The volume content percentage C1 may be 50 vol % or less. The volume content percentage C2 in the electrode extraction portion 23 may be 30 vol % or more, may be 50 vol % or more, and may be 70 vol % or more. The volume content percentage C2 may be 90 vol % or less and may be 80 vol % or less. For example, a difference D (=C2-C1) between the volume content percentage C1 and the volume content percentage C2 may be 5 vol % or more, may be 10 vol % or more, may be 20 vol % or more, and may be 30 vol % or more. As the volume content percentage C1 increases, the coefficient of thermal expansion of the electrode 22 becomes closer to the coefficient of thermal expansion of the ceramic substrate 20. Similarly, as the volume content percentage C2 increases, the coefficient of thermal expansion of the electrode extraction portion 23 becomes closer to the coefficient of thermal expansion of the ceramic substrate 20. Since C1<C2 is satisfied in the present embodiment, the coefficient of thermal expansion of the electrode extraction portion 23 is closer than the coefficient of thermal expansion of the electrode 22 to the coefficient of thermal expansion of the ceramic substrate 20. When the conductive materials contained in the electrode 22 and the electrode extraction portion 23 are materials (for example, any one or more of W, Mo, WC, and MoC) whose coefficient of thermal expansion is lower than the coefficient of thermal expansion of the ceramic material (alumina in the present embodiment) that is the main component of the ceramic substrate 20, the coefficient of thermal expansion of the electrode 22 increases as the volume content percentage C1 increases, and the coefficient of thermal expansion of the electrode extraction portion 23 increases as the volume content percentage C2 increases. When the conductive materials contained in the electrode 22 and the electrode extraction portion 23 are materials (for example, any one or more of Ru and TiN) whose coefficient of thermal expansion is higher than the coefficient of thermal expansion of the ceramic material (alumina in the present embodiment) that is the main component of the ceramic substrate 20, the coefficient of thermal expansion of the electrode 22 decreases as the volume content percentage C1 increases, and the coefficient of thermal expansion of the electrode extraction portion 23 decreases as the volume content percentage C2 increases. The electrode 22 may contain, as conductive materials, both of a material whose coefficient of thermal expansion is lower than the coefficient of thermal expansion of the ceramic material that is the main component of the ceramic substrate 20 and a material whose coefficient of thermal expansion is higher than the coefficient of thermal expansion of the ceramic material. Also in this case, when the coefficient of thermal expansion of conductive materials (a plurality of types of materials) as a whole contained in the electrode 22 is different from the coefficient of thermal expansion of the ceramic material, the coefficient of thermal expansion of the electrode 22 is varied by the volume content percentage C1. The same applies to the electrode extraction portion 23. When the coefficient of thermal expansion of conductive materials (a plurality of types of materials) as a whole contained in the electrode extraction portion 23 is different from the coefficient of thermal expansion of the ceramic material, the coefficient of thermal expansion of the electrode extraction portion 23 is varied by the volume content percentage C2. When C1<C2 is satisfied, the coefficient of thermal expansion of the electrode extraction portion 23 is closer than the coefficient of thermal expansion of the electrode 22 to the coefficient of thermal expansion of the ceramic substrate 20. It is preferable that the coefficient of thermal expansion of conductive materials (as a whole) contained in the electrode extraction portion 23 be, regardless of whether the conductive materials are of one type or a plurality of types, the same as the coefficient of thermal expansion of conductive materials (as a whole) contained in the electrode 22 or closer than the coefficient of thermal expansion of the conductive materials contained in the electrode 22 to the coefficient of thermal expansion of the ceramic material that is the main component of the ceramic substrate 20.

The volume content percentage C2 of the electrode extraction portion 23 is a value that is calculated as an area ratio of a ceramic material recognized in an observed image when a representative cross-section of the electrode extraction portion 23 is observed at a magnification of 1000× by a scanning electron microscope (SEM). The volume content percentage C1 of the electrode 22 and the volume content percentage of the main component of the ceramic substrate 20 are also values that are calculated by the same method.

The cooling plate 30 is a disc-shaped member internally having a refrigerant flow path 32 through which a refrigerant can circulate. The refrigerant flow path 32 extends in a one-stroke pattern from one end to the other end over the entire area of the cooling plate 30 in plan view. The one end and the other end of the refrigerant flow path 32 are connected to a refrigerant circulation pump (not illustrated) that can regulate the temperature of the refrigerant. The cooling plate 30 is formed, for example, of a conductive material containing metal. Examples of the conductive material include composite materials and metal. An example of the composite materials is a metal composite material (also called a metal matrix composite (MMC)), for example. Examples of MMC include a material containing Si, SiC, and Ti and porous SiC materials impregnated with Al and/or Si. A material including Si, SiC, and Ti is referred to as SisiCTi, a material including a porous SiC material impregnated with Al is referred to as AlSiC, and a material including a porous SiC material impregnated with Si is referred to as SiSiC. Examples of the metal include Al, Ti, Mo, and alloys of them. The conductive material of the cooling plate 30 preferably has a coefficient of thermal expansion close to that of the ceramic substrate 20.

The joining layer 40 bonds the lower surface of the ceramic substrate 20 and the upper surface of the cooling plate 30 to each other. The joining layer 40 may be a metal joining layer formed of brazing material or a metal brazing material, for example. The metal joining layer may be formed, for example, by TCB (thermal compression bonding). TCB is a widely known method including placing a metal bonding material between two bonding target members and pressure-bonding the two members heated to a temperature lower than or equal to the solidus line temperature of the metal bonding material. An organic adhesive layer may be employed as the joining layer 40 instead of the metal joining layer.

The power supply member 50 is a metallic member for supplying electric power to the electrode 22. The power supply member 50 is, for example, a metal rod. The power supply member 50 is electrically connected to the electrode extraction portion 23 and the electrode 22. A metal used in the power supply member 50 is, for example, W, Mo, Ni, or the like and is preferably a metal whose coefficient of thermal expansion is close to the coefficient of thermal expansion of the ceramic substrate 20. The power supply member 50 is disposed to be inserted from the lower surface of the ceramic substrate 20 and is electrically connected to the electrode extraction portion 23. More specifically, the power supply member 50 is inserted from the lower surface side of the cooling plate 30 into the power-supply-member insertion hole 28 provided in the ceramic substrate 20 through a cooling-plate through hole 34 extending through the cooling plate 30 in the up-down direction and a joining-layer through hole 44 extending through the joining layer 40 in the up-down direction. The diameter of the joining-layer through hole 44 is the same as the diameter of the cooling-plate through hole 34. The power supply member 50 passes through the inside of an insulating tube 36 disposed in the cooling-plate through hole 34 and is inserted into the power-supply-member insertion hole 28 with a margin. The outer peripheral surface of the insulating tube 36 is bonded to the inner peripheral surface of the cooling-plate through hole 34 with an adhesive layer 35 interposed therebetween. The upper end surface of the insulating tube 36 is positioned to be higher than the upper surface of the cooling plate 30 and to be lower than or at the same height as the lower surface of the ceramic substrate 20. The power-supply-member insertion hole 28 is a cylindrical hole provided in the ceramic substrate 20 and is provided to reach the electrode extraction portion 23 from the lower surface of the ceramic substrate 20.

The power supply member 50 is electrically connected to the electrode extraction portion 23 with the brazing material layer 29 interposed therebetween. The power supply member 50 is joined to the ceramic substrate 20 and the electrode extraction portion 23 by the brazing material layer 29. The brazing material layer 29 is provided in a gap between the bottom surface of the power-supply-member insertion hole 28 and a leading end surface (upper end surface) of the power supply member 50 and a gap between a side surface of the power-supply-member insertion hole 28 and a side surface of the power supply member 50. The brazing material layer 29 is made of a brazing material such as, for example, Au—Ge, Al, Ag, or Ag—Cu—Ti.

Next, a usage example of the wafer placement table 10 will be described. First, the wafer placement table 10 is disposed in a vacuum chamber (not illustrated), and then a wafer W is placed on a wafer placement surface 20a of the wafer placement table 10. Then, the power source 62 applies a voltage to the electrode 22 via the power supply member 50. This allows the wafer W to be attracted and fixed to the wafer placement surface 20a. Then, the inside of the vacuum chamber is made to have a vacuum atmosphere or a reduced-pressure atmosphere, and the wafer W is processed in the vacuum chamber. For example, the wafer W may be treated with plasma. In such a case, a top electrode having a shower head is placed on the ceiling of the vacuum chamber, and, while reaction gas is supplied from the shower head to the space between the wafer W and the top electrode, a high-frequency voltage is applied between the top electrode and the cooling plate 30 to generate plasma. After the processing of the wafer W, the application of voltage to the electrode 22 is stopped. This stops the attraction and fixation of the wafer W to the wafer placement surface 20a. A refrigerant is fed to the refrigerant flow path 32 when the wafer W needs to be cooled.

Next, regarding a method of manufacturing the wafer placement table 10, in particular, a step of manufacturing the ceramic substrate 20 and a step of joining the power supply member 50 to the electrode extraction portion 23 will be described with FIGS. 5A to 5E. FIGS. 5A to 5E are explanatory views of these steps.

Figures 5A, 5B, 5C, 5D, 5E:
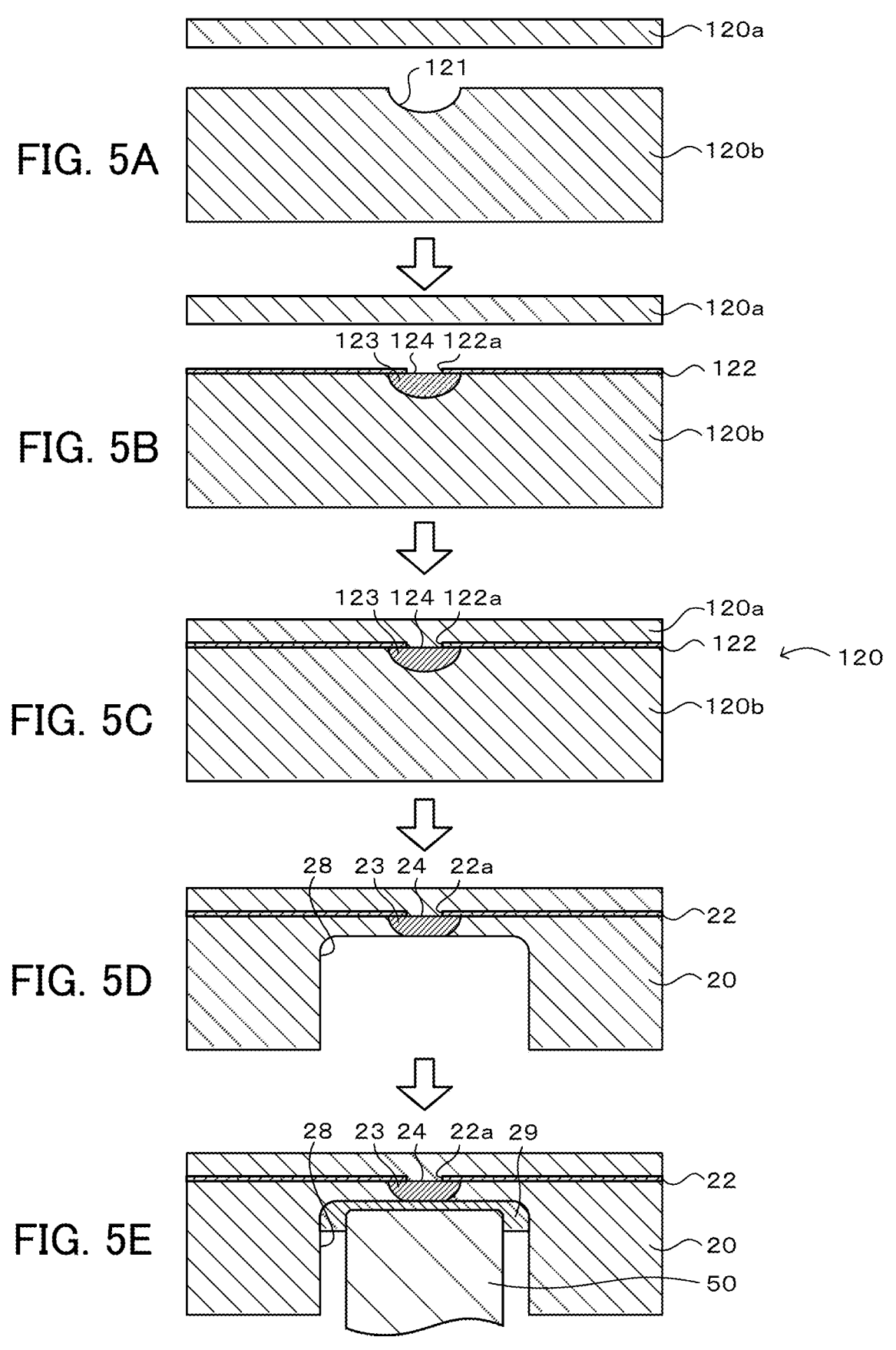
FIGS. 5A to 5E are explanatory views of a step of manufacturing a ceramic substrate 20 and a step of joining a power supply member 50 to the electrode extraction portion 23.

First, disk-shaped first and second ceramic molded bodies 120a and 120b that are molded bodies of ceramic powder are prepared by using a tape molding method, and a hole 121 having a truncated sphere shape (a shape obtained by cutting a sphere along one horizontal surface) is formed in the upper surface of the second ceramic molded body 120b by cutting (FIG. 5A). The second ceramic molded body 120b may be prepared by separately forming a plurality of layers of a molded body.

Next, a conductive paste is printed on the upper surface of the second ceramic molded body 120b into a predetermined pattern (FIG. 5B). Specifically, the conductive paste is first printed to fill the hole 121 of the second ceramic molded body 120b, thereby forming an electrode-extraction-portion precursor 123 that becomes the electrode extraction portion 23 eventually. Next, the conductive paste is printed on the upper surface of the second ceramic molded body 120b, thereby forming an electrode precursor 122 that becomes the electrode 22 eventually. The electrode precursor 122 is printed into a pattern having a shape that has a through hole 122a that becomes the through hole 22a eventually. Consequently, the lower surface of the electrode precursor 122 and the upper surface of the electrode-extraction-portion precursor 123 are in contact with each other, and a portion of the upper surface of the electrode-extraction-portion precursor 123, the portion being positioned directly under the through hole 122a, becomes a substrate joint region 124. The substrate joint region 124 is a region that becomes the substrate joint region 24 eventually. As the conductive paste, for example, a paste containing particles of conductive materials used in the electrode 22 and the electrode extraction portion 23 described above and particles of a ceramic material identical to the main component of the ceramic substrate 20 can be used. The conductive paste may contain a sintering auxiliary agent. The volume content percentages C1 and C2 described above can be adjusted by adjusting the content ratio of the ceramic material in the conductive paste.

Next, the first and second ceramic bodies 120a and 120b are layered, and a pressure is applied thereto from above and below, thereby obtaining a layered body 120 (FIG. 5C). The pressure from above and below causes a portion of the first ceramic molded body 120a to enter the inside of the through hole 122a and come into contact with the substrate joint region 124 of the electrode-extraction-portion precursor 123. This layered body 120 is subjected to hot press sintering and cooled to the normal temperature, the power-supply-member insertion hole 28 is formed by cutting, and external shape processing and thickness processing are performed, as appropriate, thereby obtaining the ceramic substrate 20 (FIG. 5D). After the hot press sintering, the electrode precursor 122 having the through hole 122a becomes the electrode 22 having the through hole 22a. After the hot press sintering and formation of the power-supply-member insertion hole 28, the electrode-extraction-portion precursor 123 having the substrate joint region 124 becomes the electrode extraction portion 23 having the substrate joint region 24. The power-supply-member insertion hole 28 can be formed by, for example, counterboring. The power-supply-member insertion hole 28 is formed to have a depth with which the electrode-extraction-portion precursor 123 is exposed at the bottom surface of the power-supply-member insertion hole 28. As a result of the counterboring at this time, a lower side portion of the electrode-extraction-portion precursor 123 is cut, and the electrode extraction portion 23 is obtained. The hot press sintering causes the electrode extraction portion 23 to be in close contact and joined with ceramic particles in the ceramic substrate 20, the ceramic particles being present around the electrode extraction portion 23. Thus, the substrate joint region 24 of the electrode extraction portion 23 becomes into close contact with ceramic particles (here, ceramic particles in the through hole 122a) in the ceramic substrate 20, the ceramic particles being present directly above the substrate joint region 24, and the substrate joint region 24 is joined to the ceramic substrate 20.

Next, the power supply member 50 and the electrode extraction portion 23 are joined to be electrically connected to each other. Specifically, a sheet, which becomes the brazing material layer 29 eventually, of a brazing material is disposed at the bottom surface of the power-supply-member insertion hole 28, and the power supply member 50 is inserted from the lower surface of the ceramic substrate 20. In other words, the sheet of the brazing material is disposed between the bottom surface (including the portion of the electrode extraction portion 23 exposed at the bottom surface) of the power-supply-member insertion hole 28 and the leading end surface of the power supply member 50. In this state, the brazing material is heated to be melt and thereafter cooled to be solidified, and the brazing material layer 29 is thereby formed (FIG. 5E). Consequently, the power supply member 50 and the electrode extraction portion 23 are joined and electrically connected to each other with the brazing material layer 29 interposed therebetween.

In parallel with such a step, the cooling plate 30 is prepared by a publicly known method, and the insulating tube 36 is attached to the cooling plate 30 with the adhesive layer 35 interposed therebetween. Then, with the joining layer 40 interposed between the cooling plate 30 and the ceramic substrate 20, the cooling plate 30 is joined to the ceramic substrate 20 that is after the above-described step is performed to obtain the wafer placement table 10. The step (FIG. 5E) of joining the power supply member 50 to the electrode extraction portion 23 may be performed before joining of the cooling plate 30 to the ceramic substrate 20 and may be performed after joining of the cooling plate 30 to the ceramic substrate 20.

In the wafer placement table 10 in the present embodiment specifically described above, the volume content percentage of the ceramic material identical to the main component of the ceramic substrate 20 is high in the electrode extraction portion 23 compared with the electrode 22. In other words, the volume content percentage C2 is higher than the volume content percentage C1. Consequently, the electrode extraction portion 23 can reduce a difference in the coefficient of thermal expansion between the ceramic substrate 20 and the electrode extraction portion 23. Therefore, separation and cracking of the electrode 22 caused by a stress applied from the electrode extraction portion 23 to the electrode 22 due to a temperature change can be suppressed. For example, when the coefficient of thermal expansion of the electrode extraction portion 23 is lower than the coefficient of thermal expansion of the ceramic substrate 20, the amount of shrinkage of the electrode extraction portion 23 (exactly, the electrode-extraction-portion precursor 123) due to a temperature change at the time of cooling, in which the layered body 120 is cooled to the normal temperature after being subjected to hot press sintering in the step of manufacturing the ceramic substrate 20, decreases compared with the ceramic substrate 20 when a difference in the coefficient of thermal expansion between the electrode extraction portion 23 and the ceramic substrate 20 is large. When the coefficient of thermal expansion of the electrode extraction portion 23 is higher than the coefficient of thermal expansion of the ceramic substrate 20, the amount of shrinkage of the electrode extraction portion 23 (exactly, the electrode-extraction-portion precursor 123) due to a temperature change at the time of the cooling increases compared with the ceramic substrate 20 when a difference in the coefficient of thermal expansion between the electrode extraction portion 23 and the ceramic substrate 20 is large. Consequently, a stress may be generated in the electrode extraction portion 23 and applied from the electrode extraction portion 23 to the electrode 22 present directly above the electrode extraction portion 23 and may cause separation or cracking of the electrode 22. This stress easily increases, in particular, around an outer peripheral edge portion of the upper surface of the electrode extraction portion 23, and separation and cracking of the electrode 22 easily occur in, for example, regions at two locations indicated by circles of dashed lines in FIG. 3. In addition, a stress may be similarly applied to the electrode 22 not only at the time of cooling after sintering of the layered body 120 but also at the time of cooling after use of the wafer placement table 10. In contrast, it is possible in the present embodiment since the volume content percentage C2 is higher than the volume content percentage C1 to suppress the stress applied from the electrode extraction portion 23 to the electrode 22 and suppress separation and cracking of the electrode 22. Meanwhile, when the volume content percentage C1 in the electrode 22 is also increased in addition to the volume content percentage C2 in the electrode extraction portion 23, there is a concern that a malfunction (for example, a deterioration in the function as the electrostatic electrode) occurs due to an excessive increase in the resistance value of the electrode 22. In contrast, it is possible in the present embodiment since the volume content percentage C1 is lower than the volume content percentage C2 to suppress a malfunction due to an excessive increase in the resistance value of the electrode 22. The electrode extraction portion 23 is not required to function as an electrostatic electrode similarly to the electrode 22. Thus, the malfunction does not easily occur in the electrode extraction portion 23, even when the resistance value increases, compared with the electrode 22. From the above, the wafer placement table 10 in the present embodiment can suppress the stress applied to the electrode 22 due to a temperature change while suppressing an increase in the resistance value of the electrode 22.

A portion of the upper surface of the electrode extraction portion 23 is the substrate joint region 24 joined to the ceramic substrate 20. Consequently, the electrode extraction portion 23 is in close contact in the substrate joint region 24 with the ceramic substrate 20. Therefore, the stress generated in the electrode extraction portion 23 described above can be suppressed by the adhering force of the substrate joint region 24 and the ceramic substrate 20. Consequently, even when a stress caused by a difference in thermal expansion between the electrode extraction portion 23 and the ceramic substrate 20 due to a temperature change is generated, the stress is not easily applied to the electrode 22.

The thickness of the electrode extraction portion 23 in the up-down direction is large compared with the electrode 22. When the electrode extraction portion 23 has a thickness larger than the thickness of the electrode 22, that is, when the volume of the electrode extraction portion 23 is large compared with when the electrode extraction portion 23 has the same thickness as the electrode 22, the stress caused by a difference in thermal expansion between the electrode extraction portion 23 and the ceramic substrate 20 due to a temperature change easily increases. Thus, significance of applying the present invention is high. Due to the electrode extraction portion 23 having a larger thickness than the electrode 22, occurrence of a situation in which not only the electrode extraction portion 23 but also the electrode 22 is cut during formation of the power-supply-member insertion hole 28 can be suppressed.

The present invention should not be limited to the above-described embodiment and may be implemented in various modes without departing from the technical scope of the present invention.

Figure 6:
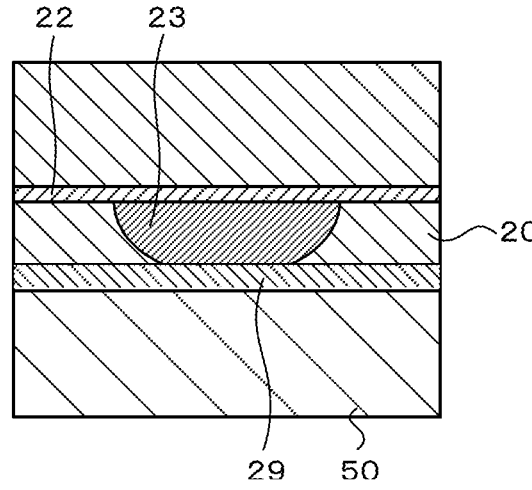
FIG. 6 is an enlarged view of a periphery of the electrode extraction portion 23 in a modification.

While the electrode extraction portion 23 has the substrate joint region 24 in the embodiment described above, for example, the electrode extraction portion 23 does not necessarily have the substrate joint region 24 as illustrated in FIG. 6. In FIG. 6, the electrode 22 does not have the through hole 22a, and the electrode 22 is present directly above the entirety of the upper surface of the electrode extraction portion 23. Thus, the upper surface of the electrode extraction portion 23 does not have the substrate joint region 24. Even in this case, since the volume content percentage C2 is higher than the volume content percentage C1, it is possible to suppress the stress that is applied to the electrode 22 due to a temperature change while suppressing an increase in the resistance value of the electrode 22.

Figure 7:
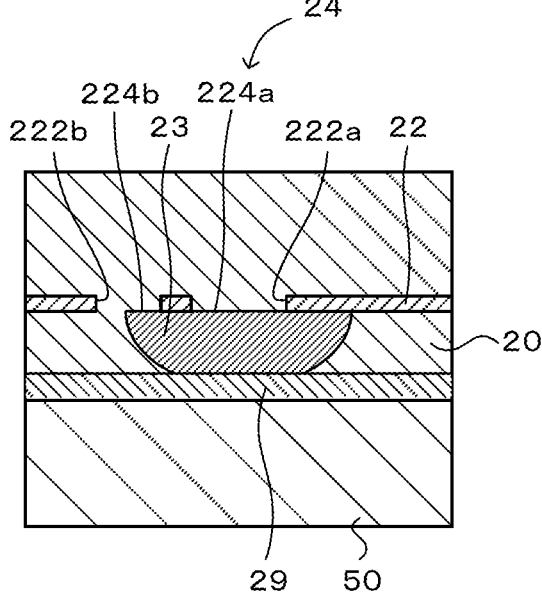
FIG. 7 is an enlarged view of a periphery of the electrode extraction portion 23 in a modification.
Figure 8:
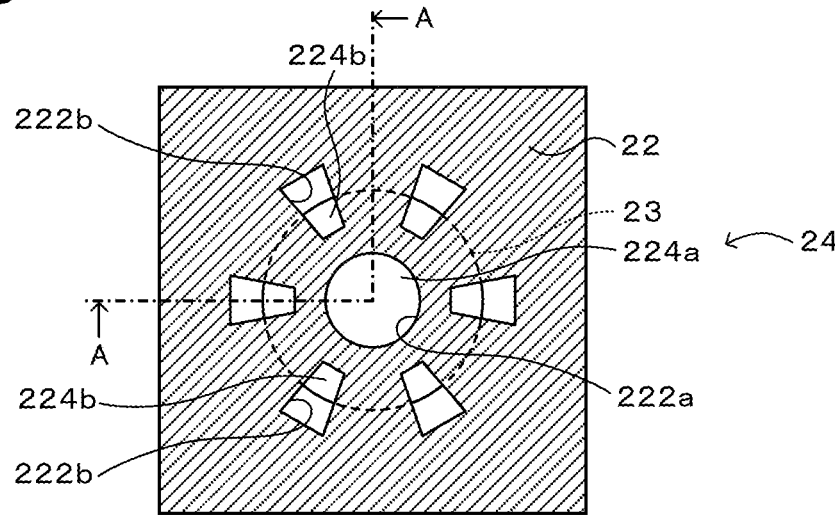
FIG. 8 is a partial top view of the electrode 22 and the electrode extraction portion 23 in a modification.

While the central portion of the upper surface of the electrode extraction portion 23 is the substrate joint region 24 in the embodiment described above, the position of the substrate joint region 24 is not limited thereto. For example, as illustrated in FIG. 7 and FIG. 8, the substrate joint region 24 may include a portion of the outer peripheral edge portion of the upper surface of the electrode extraction portion 23. FIG. 7 is a sectional view taken along line A-A in FIG. 8. In FIG. 7 and FIG. 8, the substrate joint region 24 of the electrode 22 has a region 224a and a plurality (six here) of regions 224b. Similarly to the embodiment described above, the region 224a is a region that is provided at a central portion of the upper surface of the electrode extraction portion 23 and that is positioned directly under a through hole 222a provided in the electrode 22. Therefore, the region 224a is not in contact with the electrode 22 and is joined to the ceramic substrate 20. In addition, the electrode 22 is provided with a plurality (six here) of trapezoidal through holes 222b that are provided over the outer peripheral edge portion (a circular contour line portion of the electrode extraction portion 23 illustrated in FIG. 8) of the electrode extraction portion 23 to extend from the inside to the outside of the electrode extraction portion 23 in the radial direction in top view. Consequently, the regions 224b including portions (portions of the contour line of the electrode extraction portion 23, the contour line being indicated by solid lines in FIG. 8) of the outer peripheral edge portion of the upper surface of the electrode extraction portion 23 are not in contact with the electrode 22 and serve as portions of the substrate joint region 24 joined to the ceramic substrate 20. In the upper surface of the electrode extraction portion 23, a portion other than the substrate joint region 24 (the regions 224a and 224b) is electrically connected to the lower surface of the electrode 22. As described above, the stress that is applied to the electrode 22 due to a temperature change easily increases, in particular, around the outer peripheral edge portion of the upper surface of the electrode extraction portion 23. Therefore, due to a portion of the outer peripheral edge portion being included in the regions 224b of the substrate joint region 24, the stress that is applied to the electrode 22 due to temperature change can be further reduced. If the entirety of the outer peripheral edge portion of the upper surface of the electrode extraction portion 23 is the substrate joint region 24, the electrode extraction portion 23 and the electrode 22 are not electrically connected to each other. Thus, a portion, instead of the entirety, of the outer peripheral edge portion of the upper surface of the electrode extraction portion 23 is included in the substrate joint region 24 in FIG. 7 and FIG. 8. In FIG. 7 and FIG. 8, the number of the regions 224b may be one. In FIG. 7 and FIG. 8, the substrate joint region 24 does not necessarily include the region 224a. In other words, the electrode 22 does not necessarily have the through hole 222a.

Figures 9, 10:
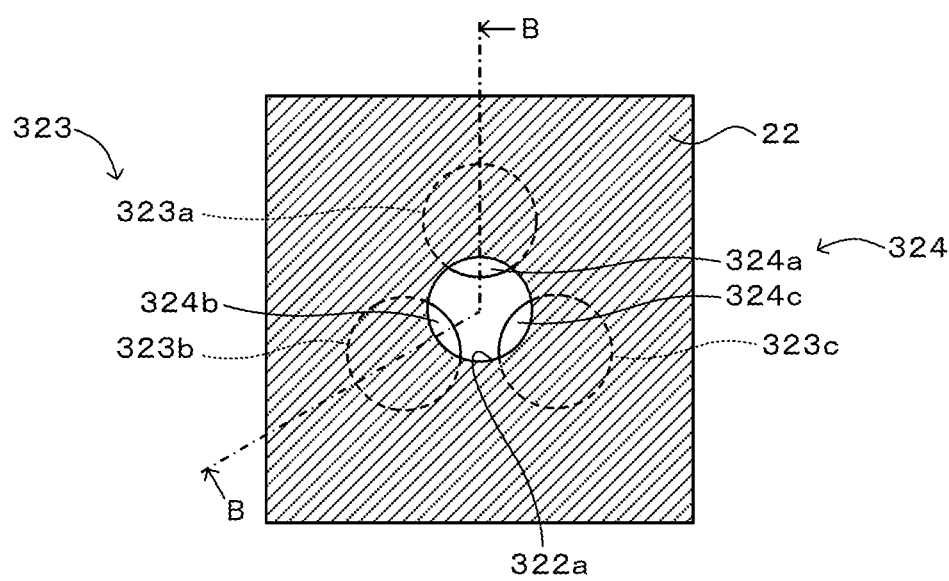
FIG. 9 is an enlarged view of a periphery of an electrode extraction portion 323 in a modification.
FIG. 10 is a partial top view of the electrode 22 and the electrode extraction portion 323 in a modification.

While one electrode extraction portion 23 is provided with respect to one power supply member 50 in the embodiment described above, the number thereof with respect to one power supply member 50 is not limited thereto. A plurality of the electrode extraction portions 23 may be provided with respect to one power supply member 50. For example, as illustrated in FIG. 9 and FIG. 10, three electrode extraction portions 323a to 323c as the electrode extraction portion 323 may be provided with respect to one power supply member 50. FIG. 9 is a sectional view taken along line B-B in FIG. 10. In FIG. 9 and FIG. 10, the electrode extraction portion 323 includes the three electrode extraction portions 323a to 323c that are disposed to be spaced from each other. A substrate joint region 324 has regions 324a to 324c that are portions of respective upper surfaces of three electrode extraction portions 323a to 323c. Each of the electrode extraction portions 323a to 323c is a member having a spherical frustum shape and is connected at the lower surface thereof to the power supply member 50 to be electrically connected thereto with the brazing material layer 29 therebetween. The electrode 22 has a through hole 322a similar to the through hole 22a. The through hole 322a is provided over the outer peripheral edge portion of each of the electrode extraction portions 323a to 323c to extend from the inside to the outside in the radial direction in top view. Consequently, the regions 324a to 324c including portions (portions of the contour lines of the electrode extraction portions 323a to 323c illustrated in FIG. 10, the portions being indicated by solid lines) of respective outer peripheral edge portions of the electrode extraction portions 323a to 323c are not in contact with the electrode 22 and serve as the substrate joint region 324 that is joined to the ceramic substrate 20. In the upper surface of the electrode extraction portion 323, a portion other than the substrate joint region 324 (regions 324a to 324c) is in contact with and electrically connected to the lower surface of the electrode 22. Since this electrode extraction portion 323 is divided into the plurality of electrode extraction portions 323a to 323c, the stress caused by a difference in thermal expansion between the electrode extraction portion 323 and the ceramic substrate 20 due to a temperature change can be reduced compared with when one electrode extraction portion 23 having a volume that is the same as a total volume of the plurality of electrode extraction portions 323a to 323c is provided. A portion of the outer peripheral edge portion of the upper surface of each of the plurality of electrode extraction portions 323a to 323c is included in the substrate joint region 324 (the regions 324a to 324c). Therefore, similarly to the electrode extraction portion 23 illustrated in FIG. 7 and FIG. 8, the stress that is applied from the electrode extraction portion 323 to the electrode 22 due to a temperature change can be further reduced. In FIG. 9 and FIG. 10, the electrode 22 does not necessarily have the through hole 322a, and the substrate joint region 324 is not necessarily present. In addition, one or more of the regions 324a to 324c of the electrode extraction portions 323a to 323c do not necessarily each include a portion of the outer peripheral edge portion of the upper surface of a corresponding one of the electrode extraction portions 323a to 323c. That is, for example, one or more of the regions 324a to 324c of the electrode extraction portions 323a to 323c may be each positioned at the center of a corresponding one of the electrode extraction portions 323a to 323c. Even in these cases, the above-described effect due to the electrode extraction portion 323 being divided into the plurality of electrode extraction portions 323a to 323c can be obtained.

Figure 11:
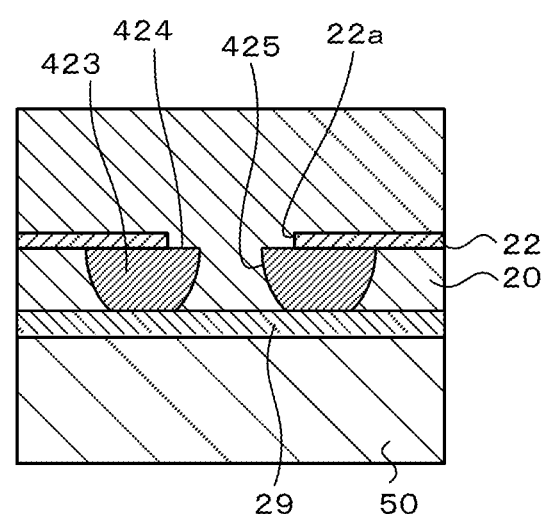
FIG. 11 is an enlarged view of a periphery of an electrode extraction portion 423 in a modification.
Figure 12:
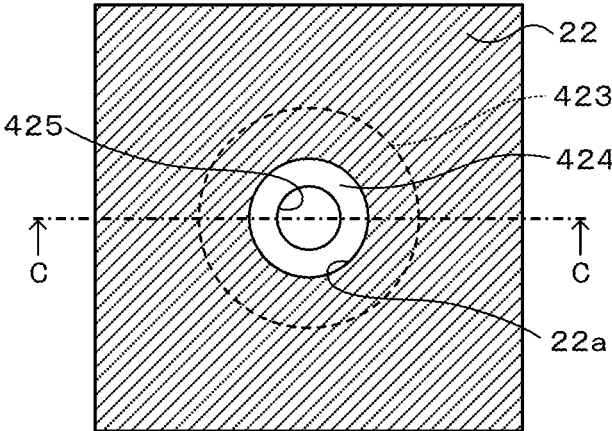
FIG. 12 is a partial top view of the electrode 22 and the electrode extraction portion 423 in a modification.

In the embodiment described above, the electrode extraction portion 23 may have a through hole that extends through the electrode extraction portion 23 in the up-down direction. For example, as illustrated in FIG. 11 and FIG. 12, the electrode extraction portion 423 may have a through hole 425. FIG. 11 is a sectional view taken along line C-C in FIG. 12. In FIG. 11 and FIG. 12, since the electrode extraction portion 423 has the through hole 425 extending through the electrode extraction portion 423 in the up-down direction, a ring-shaped region included in the upper surface of the electrode extraction portion 423 and positioned directly under the through hole 22a is a substrate joint region 424. The electrode extraction portion 423 has a reduced volume due to having the through hole 425 and thus can reduce the stress caused by a difference in thermal expansion between the electrode extraction portion 423 and the ceramic substrate 20 due to a temperature change. In FIG. 11 and FIG. 12, the electrode 22 does not necessarily have the through hole 22a, and the substrate joint region 424 is not necessarily present. Even in this case, the above-described effect due to the electrode extraction portion 423 having the through hole 425 can be obtained. Alternatively, in FIG. 11 and FIG. 12, the through holes 222b illustrated in FIG. 7 and FIG. 8 may be added to the electrode 22, and the regions 224b illustrated in FIG. 7 and FIG. 8 may be added as portions of the substrate joint region 424.

While the electrode extraction portion 23 has the spherical frustum shape in the embodiment described above, the shape thereof is not limited thereto. For example, the electrode extraction portion 23 may have a cylindrical shape.

While the electrode 22 is the electrostatic electrode in the embodiment described above, the electrode 22 is not limited thereto and may be a heater electrode or a RF electrode (a high frequency electrode for plasma generation). Significance of applying the present invention is high when the electrode 22 is a heater electrode or a RF electrode, since there is a concern that a malfunction due to an excessive increase in the resistance value of the electrode 22 occurs. For example, when the electrode 22 is a heater electrode and if the resistance value of the electrode 22 excessively increases, there is a concern of occurrence of a malfunction such as an excessive increase in the voltage of a power source that should be applied to obtain a required heat generation amount. When the electrode 22 is a RF electrode and if the resistance value of the electrode 22 excessively increases, the electrode 22 itself generates heat at the time of application of a RF and may be broken or electric power consumed by the electrode 22 may increase. Thus, there is a concern that, for example, the amount of generated plasma decreases. Application of the present invention can suppress separation and cracking of the electrode 22 while suppressing such malfunctions. In the embodiment described above, the wafer placement table 10 may include two or more of an electrostatic electrode, a heater electrode, and a RF electrode that are incorporated in the ceramic substrate 20. In this case, it is sufficient to apply the present invention to at least one of incorporated electrodes.

While the electrode 22 is a tabular electrode in the embodiment described above, the electrode 22 is not limited thereto and may be, for example, a mesh-shaped electrode. In this case, when a portion of the upper surface of the electrode extraction portion 23 is a region with openings of the mesh of the electrode 22 being present directly above the region (in other words, without being in contact with the electrode 22) and when the region is joined to the ceramic substrate 20, it can be said that the region is a substrate joint region.

Although not particularly described in the embodiment described above, the area of the substrate joint region 24 may be 1.2 mm$^2$ or more. When the substrate joint region includes a plurality of regions as illustrated in FIG. 7 to FIG. 10, the area of each of the plurality of regions may be 1.2 mm$^2$ or more. Not limited to the case in which each of the plurality of regions has an area of 1.2 mm$^2$ or more, one or more regions each having an area of 1.2 mm$^2$ or more may be included in the plurality of regions.

In the above-described embodiment, a metal rod was described as an example of the power supply member 50. However, the power supply member 50 should not be limited to this and may be a metal cable, for example.

International Application No. PCT/JP2023/032177, filed on Sep. 4, 2023, is incorporated herein by reference in its entirety.

What is claimed is:

1. A wafer placement table comprising:
   a ceramic substrate that has a wafer placement surface at an upper surface of the ceramic substrate;
   an electrode that is incorporated in the ceramic substrate; and
   an electrically conductive electrode extraction portion that is incorporated in the ceramic substrate and is electrically connected to the electrode,
   wherein each of the electrode and the electrically conductive electrode extraction portion include a ceramic material, wherein a volume content percentage of the ceramic material that is identical to a main component of the ceramic substrate is high in the electrically conductive electrode extraction portion compared with the electrode; and wherein the volume content percentage C1 of the ceramic material in the electrode is 10 vol % or more, and the volume content percentage C2 of the ceramic material in the electrically conductive electrode extraction portion is 30 vol % or more.

2. The wafer placement table according to claim 1, wherein a portion of an upper surface of the electrically conductive electrode extraction portion is a substrate joint region that is joined to the ceramic substrate.

3. The wafer placement table according to claim 2, wherein the substrate joint region includes a portion of an outer peripheral edge portion of the upper surface of the electrically conductive electrode extraction portion.

4. The wafer placement table according to claim 3, comprising:

a power supply member that is disposed to be inserted from a lower surface of the ceramic substrate and is electrically connected to the electrically conductive electrode extraction portion, wherein a plurality of the electrically conductive electrode extraction portions are provided with respect to the power supply member, which is one power supply member.

5. The wafer placement table according to claim 4, wherein the electrically conductive electrode extraction portion has a large thickness in an up-down direction compared with the electrode.

6. The wafer placement table according to claim 3, wherein the electrically conductive electrode extraction portion has a through hole that extends through the electrode extraction portion in an up-down direction.

7. The wafer placement table according to claim 3, wherein the electrically conductive electrode extraction portion has a large thickness in an up-down direction compared with the electrode.

8. The wafer placement table according to claim 2, comprising:

a power supply member that is disposed to be inserted from a lower surface of the ceramic substrate and is electrically connected to the electrically conductive electrode extraction portion, wherein a plurality of the electrically conductive electrode extraction portions are provided with respect to the power supply member, which is one power supply member.

9. The wafer placement table according to claim 2, wherein the electrically conductive electrode extraction portion has a through hole that extends through the electrode extraction portion in an up-down direction.

10. The wafer placement table according to claim 9, wherein the electrically conductive electrode extraction portion has a large thickness in an up-down direction compared with the electrode.

11. The wafer placement table according to claim 2, wherein the electrically conductive electrode extraction portion has a large thickness in an up-down direction compared with the electrode.

12. The wafer placement table according to claim 1, comprising:

a power supply member that is disposed to be inserted from a lower surface of the ceramic substrate and is electrically connected to the electrically conductive electrode extraction portion, wherein a plurality of the electrically conductive electrode extraction portions are provided with respect to the power supply member, which is one power supply member.

13. The wafer placement table according to claim 12, wherein the electrically conductive electrode extraction portion has a through hole that extends through the electrode extraction portion in an up-down direction.

14. The wafer placement table according to claim 12, wherein the electrically conductive electrode extraction portion has a large thickness in an up-down direction compared with the electrode.

15. The wafer placement table according to claim 1, wherein the electrically conductive electrode extraction portion has a through hole that extends through the electrode extraction portion in an up-down direction.

16. The wafer placement table according to claim 15, wherein the electrically conductive electrode extraction portion has a large thickness in an up-down direction compared with the electrode.

17. The wafer placement table according to claim 1, wherein the electrically conductive electrode extraction portion has a large thickness in an up-down direction compared with the electrode.

18. The wafer placement table according to claim 1, wherein the ceramic material is alumina or aluminum nitride.

* * * * *